United States Patent [19]
Maki et al.

[11] Patent Number: 5,959,334
[45] Date of Patent: Sep. 28, 1999

[54] SEMICONDUCTOR MEMORY DEVICE

[75] Inventors: Yukio Maki; Hiroki Honda, both of Tokyo, Japan

[73] Assignee: Mitsubishi Denki Kabushiki Kaisha, Tokyo, Japan

[21] Appl. No.: 08/850,743

[22] Filed: May 2, 1997

[30] Foreign Application Priority Data

Nov. 29, 1996 [JP] Japan ................................. 8-319510

[51] Int. Cl.$^6$ ............................. H01L 29/76; H01L 29/94
[52] U.S. Cl. .................... 257/378; 257/370; 257/577; 257/903; 365/154; 365/174; 365/177
[58] Field of Search ................................. 257/370, 378, 257/577, 903; 365/154, 174, 177

[56] References Cited

U.S. PATENT DOCUMENTS

| | | |
|---|---|---|
| 4,868,628 | 9/1989 | Simmons . |
| 5,428,243 | 6/1995 | Wylie ........................................ 257/592 |
| 5,480,816 | 1/1996 | Uga et al. . |
| 5,483,483 | 1/1996 | Choi et al. . |
| 5,687,111 | 11/1997 | Wada et al. .............................. 365/154 |

OTHER PUBLICATIONS

*An Ultra–Shallow Link Base for a Double Polysilicon Bipolar Transistor*, J.D. Hayden et al., 1992IEEE, pp. 96–99.

*Primary Examiner*—Valencia Martin-Wallace
*Attorney, Agent, or Firm*—McDermott, Will & Emery

[57] ABSTRACT

A bipolar transistor is formed by forming a base region continuing from a source/drain region of an MOS transistor, as a link base region, and forming an emitter region at a bit line contact hole by impurity implantation. Alternatively, the bipolar transistor is formed by forming an intrinsic base region and an emitter region at a bit line contact hole by impurity implantation. The intrinsic base region is made deeper than the source/drain region. Further, the impurity of the intrinsic base region is made different from that of the link base region.

13 Claims, 11 Drawing Sheets

SEMICONDUCTOR MEMORY DEVICE

TECHNICAL FIELD

The present invention relates to a semiconductor memory device, and more particularly to a semiconductor memory device which includes a bipolar transistor in the region of a metal-oxide-semiconductor (MOS) transistor of the memory section.

BACKGROUND ART

In FIG. 25, there is shown an equivalent circuit of a static random access memory (SRAM) cell as a conventional semiconductor memory device. The conventional SRAM cell is constituted by 6 elements, i.e., access transistors Q1 and Q2, driver transistors Q3 and Q4 and load elements R1 and R2. Bit lines BL and a word line WL are connected to the access transistors Q1 and Q2, and a power-source line Vcc is connected to the load elements R1 and R2.

The conventional memory cell, however, cannot operate well when the column current is reduced due to a reduced power-source voltage. As shown in FIG. 26, there has been proposed a memory cell where bipolar transistors Q5 and Q6 are connected to the access transistors Q1 and Q2 to amplify the column current.

In the case of a memory cell such as shown in FIG. 26, the number of elements is increased from the conventional 6 elements to 8 elements, so that the memory cell area tends to be increased. Therefore, a technique is desired which forms the bipolar transistor Q5 and Q6 in the memory cell without increasing the memory cell area.

DISCLOSURE OF THE INVENTION

Accordingly, the present invention has been made in order to solve such problems. It is an object of the present invention to provide a semiconductor memory device and its fabricating method which includes bipolar transistors in the MOS transistor region without increasing area.

According to one aspect of the present invention, a semiconductor memory device comprises a metal-oxide-semiconductor (MOS) transistor and a bipolar transistor. The metal-oxide-semiconductor (MOS) transistor has source/drain regions located across a channel region formed on a principal plane of a semiconductor region in a semiconductor memory section, the bipolar transistor has an emitter region, a base region and a collector region. The emitter region is formed at a contact hole for the source/drain region. The base region is constituted by a region common to the source/drain region. The collector region is constituted by the semiconductor region.

In another aspect of the present invention, in the semiconductor memory device, an intrinsic base region is disposed between the emitter region and the collector region of the bipolar transistor, and the intrinsic base region is made deeper than the above base region.

In another aspect of the present invention, in the semiconductor memory device, the source/drain region is made shallow, and the intrinsic base region is made deeper than the source/drain region.

In another aspect of the present invention, in the semiconductor memory device, a main impurity, common to both the source/drain regions of the MOS transistor and the link base region of the bipolar transistor, is different from that of the intrinsic base region of the bipolar transistor.

In another aspect of the present invention, in the semiconductor memory device, a main impurity, common to both the source/drain regions of the MOS transistor and the link base region of the bipolar transistor, is arsenic, and a main impurity of the intrinsic base region of the bipolar transistor is phosphorus.

In another aspect of the present invention, in the semiconductor memory device, the MOS transistor is formed as an access transistor of a static random access memory (SRAM) cell, and the bipolar transistor is formed at a bit line contact hole of the MOS transistor.

In another aspect of the present invention, in the semiconductor memory device, the semiconductor region is of a p type material, one of the source/drain regions is of an n– type material, and the other of the source/drain regions is of an n+ type material.

In another aspect of the present invention, in the semiconductor memory device, the semiconductor region is of a p type material, and both of the source/drain regions are of n– type material.

In another aspect of the present invention, in the semiconductor memory device, the semiconductor region is of a p type material, and the source/drain region and the base region are of n– type material with phosphorus as a main impurity.

In another aspect of the present invention, in the semiconductor memory device, the emitter region of the bipolar transistor is formed simultaneously with the formation of a contact layer for a source/drain region of another MOS transistor of a conductivity type opposite that of the MOS transistor.

In another aspect of the present invention, in the semiconductor memory device, the sum of the impurity concentration of the emitter region of the bipolar transistor and the impurity concentration of the source/drain region of the another MOS transistor is substantially equal to the impurity concentration of the source/drain region of the another MOS transistor.

According to another aspect of the present invention, in a method of fabricating a semiconductor memory device, a metal-oxide-semiconductor (MOS) transistor and a bipolar transistor are formed as follows. The metal-oxide-semiconductor (MOS) transistor is formed by forming a channel region on a principal plane of a semiconductor region in a semiconductor memory section and by forming source/drain regions across the channel region. A bipolar transistor is formed by forming an emitter region at a contact hole for the source/drain region, by forming a base region constituted by a region common to the source/drain region, and by forming a collector region constituted by the semiconductor region.

In another aspect of the present invention, in the method of fabricating a semiconductor memory device, an intrinsic base region is further formed at the contact hole for the source/drain region, and the emitter region is formed shallower than the intrinsic base region.

In another aspect of the present invention, in the method of fabricating a semiconductor memory device, the source/drain region is formed shallow, and the intrinsic base region is formed deeper than the source/drain region.

In another aspect of the present invention, in the method of fabricating a semiconductor memory device, a main impurity, different from a main impurity common to both the source/drain regions and the link base region, is implanted into the intrinsic base region.

In another aspect of the present invention, in the method of fabricating a semiconductor memory device, arsenic is implanted as a main impurity common to both the source/drain regions of the MOS transistor and the base region of the bipolar transistor, and phosphorus is implanted as a main impurity of the intrinsic base region of the bipolar transistor.

In another aspect of the present invention, in the method of fabricating a semiconductor memory device, the MOS transistor is formed as an access transistor of a static random access memory (SRAM) cell, and the bipolar transistor is formed at a bit line contact hole of the MOS transistor.

In another aspect of the present invention, in the method of fabricating a semiconductor memory device, the semiconductor region is of a p type material, and one of the source/drain regions of the MOS transistor is of an n− type material and the other of the source/drain regions of the MOS transistor is of an n+ type material.

In another aspect of the present invention, in the method of fabricating a semiconductor memory device, the semiconductor region is of a p type material, and both of the source/drain regions of the MOS transistor are of n− type material.

In another aspect of the present invention, in the method of fabricating a semiconductor memory device, the emitter region of the bipolar transistor is formed simultaneously with the formation of a contact layer for a source/drain region of another MOS transistor of a conductivity type opposite that of the MOS transistor.

Other features and advantages of this invention will become more apparent from the following descriptions.

A method of fabricating a semiconductor memory device of the present invention will next be described.

Figure 1:
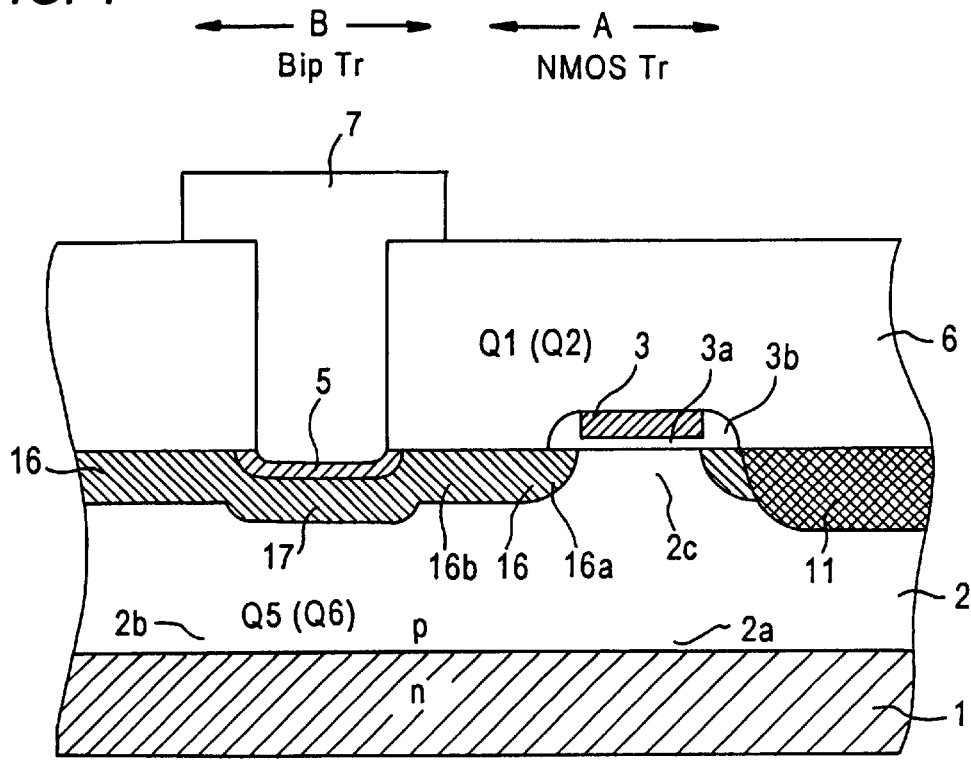
FIG. 1 shows a cross sectional view of a structure of a SRAM cell as an example of a semiconductor memory device constructed in accordance with a first embodiment of the present invention.

FIGS. 5 through 11 show a method of fabricating a semiconductor memory device which has the structure shown in FIG. 1 as a fifth embodiment of the present invention.

Figure 2:
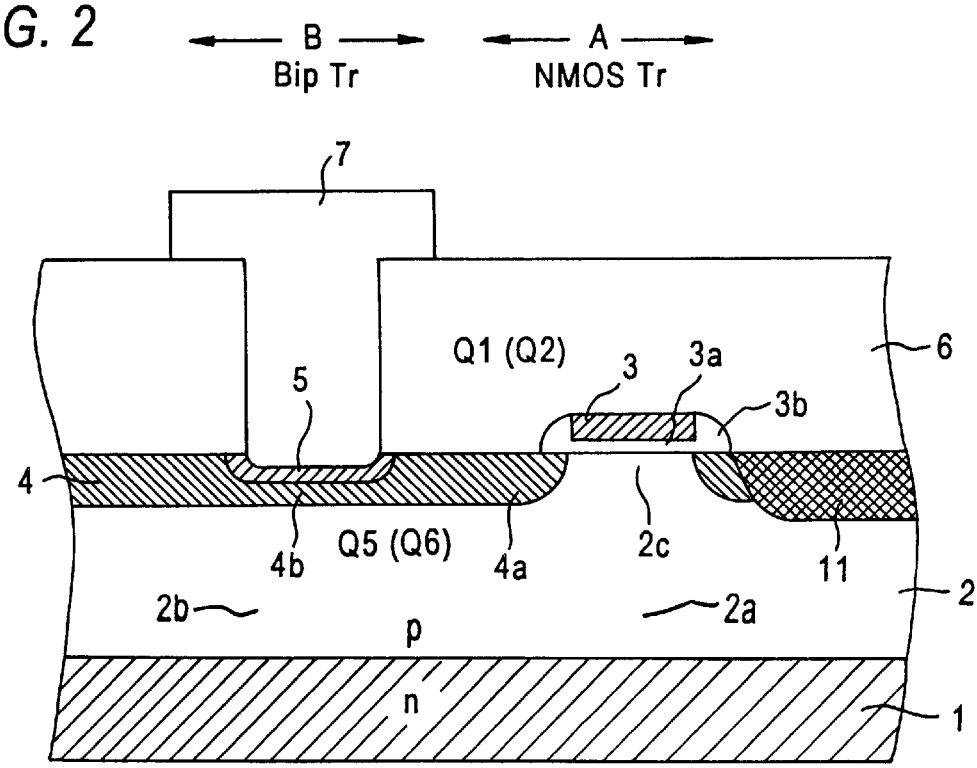
FIG. 2 shows a cross sectional view of a structure of a SRAM cell as an example of a semiconductor memory device constructed in accordance with a second embodiment of the present invention.

FIGS. 12 through 18 show a method of fabricating a semiconductor memory device which has the structure show in FIG. 2 as a sixth embodiment of the preset invention.

FIGS. 19 through 24 show a method of fabricating a semiconductor memory device which has a CMOS structure as a seventh embodiment of the present invention.

Figure 25:
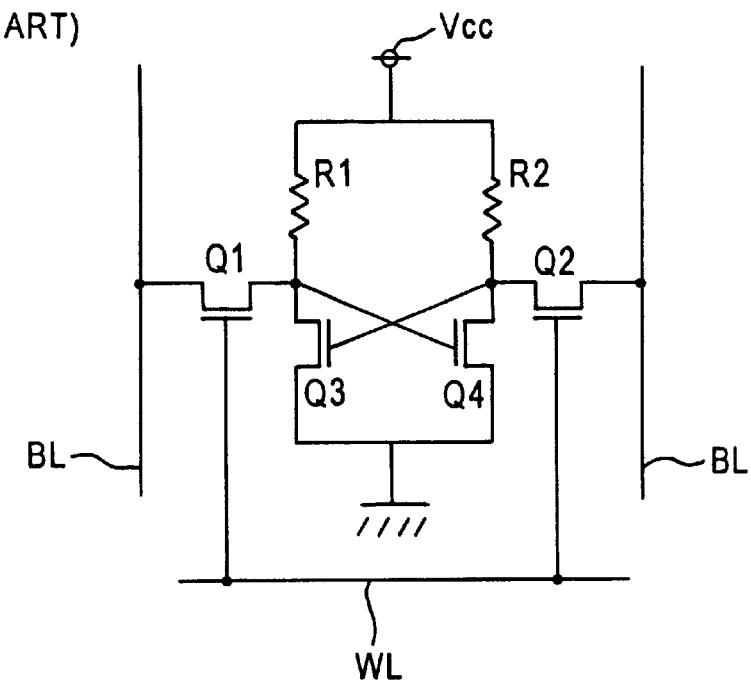
Figure 26:
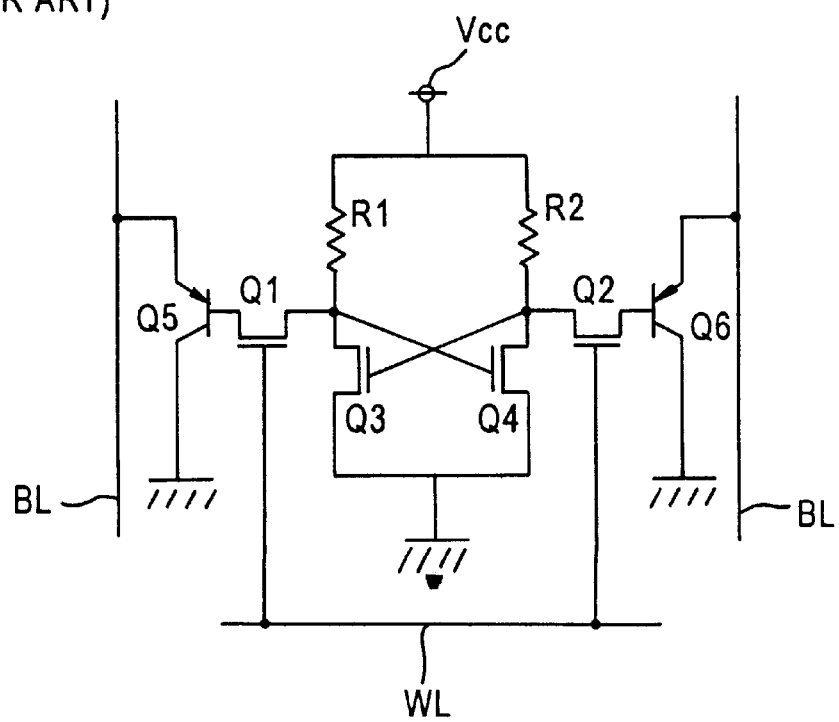

FIGS. 25 and 26 show a circuit of a static random access memory (SRAM) cell as a conventional semiconductor memory device.

BEST MODE FOR CARRYING OUT THE INVENTION

This invention will be described in further detail by way of example with reference to the accompanying drawings.

Embodiment 1

Referring to FIG. 1, there is shown a structure of a semiconductor memory device constructed in accordance with a first embodiment of the present invention. This embodiment is an example of the case where the structure of the semiconductor memory device of this invention is applied to the SRAM cell having circuit constitution shown in FIG. 26. In this embodiment, in order to avoid an increase in the memory cell area when bipolar transistors are formed in the SRAM cell, bipolar PNP type transistors are formed in the bit line contact portion of the SRAM cell.

In FIG. 1, a section A is a region in which there is formed an n-channel metal-oxide-semiconductor (NMOS) transistor Q1 (or Q2) which works as an access transistor of the SPAM cell, and a section B is a region in which there is formed a bipolar PNP type transistor Q5 (or Q6) which is connected between the NMOS transistor and a bit line.

Also, in FIG. 1 there is an n type silicon semiconductor substrate (or an n type well region) 1, and a p type semiconductor region (a well region) 2 is formed on the semiconductor substrate 1. The p type semiconductor region 2 includes a well region 2a of the memory cell and the collector region 2b of the bipolar transistor Q5. A principal plane 2c of the semiconductor region 2 becomes a channel region of the NMOS transistor Q1. A gate 3 and a gate oxide film 3a of the access transistor Q1 are formed on the principal plane 2c. An n type semiconductor region 11 having high impurity concentration is an n+ source region (or a drain region) An n type semiconductor region 16 includes a drain region (or a source region) 16a of the access transistor Q1 and a link base region 16b of the bipolar transistor Q5. An intrinsic base region 17 is formed in the link base region 16b. Also, an emitter 5 is formed on the intrinsic base region 17 for the bipolar transistor Q5. Further, an interlayer insulation film 6 is formed on the transistors Q1 and Q5, and an emitter electrode 7 is formed through the interlayer insulation film 6 to reach a bit line. The emitter electrode 7 is formed at a position of a bit line contact electrode to the drain region (or the source region) 16a of the access transistor Q5. While the description is given for a case where the memory cell is formed on the n type semiconductor substrate 1, the same may be applied for a case where the memory cell is formed surrounded by an n type region.

The NMOS transistor Q1 as an access transistor is constituted by the source region (or drain region) 11, the drain region (or source region) 16a, the channel region 2c, and the gate 3. The bipolar transistor Q5 is constituted by the emitter 5, the link base region 16b, the intrinsic base region 17, and the collector 2b.

In the semiconductor SRAM device formed in the aforementioned way, the n type semiconductor layer 16 is shared by the drain region (or the source region) 16a of the access transistor Q1 and the link base region 16b of the bipolar transistor Q5, so that the access transistor Q1 and the bipolar transistor Q5 are connected within the same semiconductor substrate 1. In addition, the emitter 5 is formed for the bipolar transistor Q5 at the portion of a bit line contact. Thus, the bipolar transistor can be fabricated without increasing the memory cell area on the silicon substrate 1 in comparison with the convention memory cell.

In the aforementioned structure, the intrinsic base region 17 is formed as the base region of the bipolar transistor Q5 after the emitter opening is formed. Therefore, this structure is advantageous in that fluctuation in the characteristics of the bipolar transistor Q5 is minimized, as compared to the case where the fluctuation in the characteristics of the bipolar transistor is caused by fluctuation of the etching of the emitter opening.

Further, in a structure such as this, in order to avoid decreasing of the punch-through margin or break down voltage characteristic of the access transistor Q1, it is desirable that arsenic (As) with a small diffusion coefficient be implanted as the main impurity of the n type semiconductor layer 16 which includes the drain region (or the source region) 16a of the access transistor Q1. It is also desirable that phosphorus (P) with a large diffusion coefficient is implanted as the main impurity of the intrinsic base region 17. Thereby, the base region of the bipolar transistor Q5 is firmly secured, and the characteristics of the bipolar transistor Q5 are made stable.

Implanting arsenic (As) having small diffusion coefficient into the drain region (or the source region) 16a can meet the requirement of the fine-structure of the MOS transistor for a reduced size memory cell.

In the memory cell of the semiconductor memory device, the minimum transistor gate length and isolation width are used in order to enhance integration. Therefore, it is desirable that the n– region (the drain region or the source region) of the MOS transistor, which corresponds to the base region of the bipolar transistor, be shallower, and for example, the depth needs to be less than about 0.1 μm.

On the other hand, in the case where the bipolar transistor is formed, it is not desirable that such a shallow n– region is used as the base region of the bipolar transistor. This is because a bipolar transistor with stable characteristics cannot be obtained with such a shallow n– region. For this reason, it is preferable to form an intrinsic base layer. Thus, the intrinsic base layer needs to be deeper than the emitter of the bipolar transistor. For example, in the case where the emitter is formed by implantation, the emitter depth becomes about 0.1 to 0.2 μm, so that the intrinsic base layer is made deeper than that. For this reason, in order to meet both the necessary requirements for the MOS transistor and for the bipolar transistor, it is particularly effective that a bipolar transistor is formed with a link base structure within the memory cell.

Embodiment 2

Referring to FIG. 2, there is shown a structure of a semiconductor memory device constructed in accordance with a second embodiment of the present invention. This embodiment is another example where the structure of the semiconductor memory device of the present invention is applied to the SRAM cell of the circuit constitution shown in FIG. 26. Also in the second embodiment, in order to avoid an increase in the memory cell area when bipolar transistors are formed in the SRAN cell, the bipolar PNP type transistors are formed at a portion of the position of the bit line contact of the SRAM cell.

In FIG. 2, a section A is a region in which there is formed an NMOS transistor Q1 (or Q2) which works as an access transistor of the SRAM cell, and a section B is a region in which a bipolar PNP type transistor Q5 (or Q6) is formed between the NMOS transistor and a bit line.

In FIG. 2, as with the structure shown in FIG. 1, there is shown an n type silicon semiconductor substrate (or an n type well region) 1, and a p type semiconductor region (a well region) 2 is formed on the semiconductor substrate 1. The p type semiconductor region 2 includes a well 2a of the memory cell, and a collector region 2b of the bipolar transistor Q5. A channel region 2c of the NMOS transistor Q1 is formed on the surface of the semiconductor region 2. A gate oxide film 3a and a gate 3 of the access transistor Q1 is formed on the channel region 2c. An emitter 5 is formed for the bipolar transistor Q5. An interlayer insulation film 6 is formed on the transistors Q1 and Q5. An emitter electrode 7 is formed through the interlayer insulation film 6. An n+ source region (or a drain region) 11 is formed for the NMOS transistor Q1.

However, the second embodiment differs from the first embodiment of FIG. 1 with respect to the following points. That is, in FIG. 2, an n type semiconductor region 4 with a sufficient thickness includes a drain region (or a source region) 4a of the access transistor Q1, and a base region 4b of the bipolar transistor Q5. Thus, there is no region which corresponds to the intrinsic base region 17 shown in FIG. 1.

The NMOS transistor Q1 which works as an access transistor is formed by the source region (or drain region) 11, the drain (or source) region 4a, the channel region 2c, and the gate 3. The bipolar transistor Q5 is constituted by the emitter 5, the base 4b, and the collector 2b.

In the semiconductor SRAM device formed in the aforementioned way, the n type semiconductor layer 4 is shared by the drain (or source) region 4a of the access transistor Q1 and the base region 4b of the bipolar transistor Q5. Thus, the access transistor Q1 and the bipolar transistor Q5 are connected together within the same semiconductor substrate. In addition, since the emitter 5 is formed at the position of the bit line contact portion to form the bipolar transistor Q5, the bipolar transistor can be fabricated on the silicon substrate 1 without increasing the memory cell area in comparison with the conventional memory cell.

In a structure such as this, the n type semiconductor region 4 is also used as the base 4b of the bipolar transistor. In order to obtain a bipolar transistor having stable characteristics, there is the need to form a base layer which has a sufficient thickness. For this reason, as compared with the case where arsenic (As) with a small diffusion coefficient is employed, phosphorus (P) with a large diffusion coefficient is more effective as the impurity of the n type semiconductor region 4. This is because the base region 4b of the bipolar transistor Q5 can be firmly secured, and also the process margin becomes larger. If arsenic (As) is employed as the impurity of the n type semiconductor region 4, an impurity implantation energy of a few hundred kev will become necessary for obtaining the same impurity implantation as the case of phosphorus (P), and consequently the manufacturing efficiency will be reduced. Thus, in the second embodiment of FIG. 2, an impurity such as phosphorus (P) is suitable.

Embodiment 3

Figure 3:
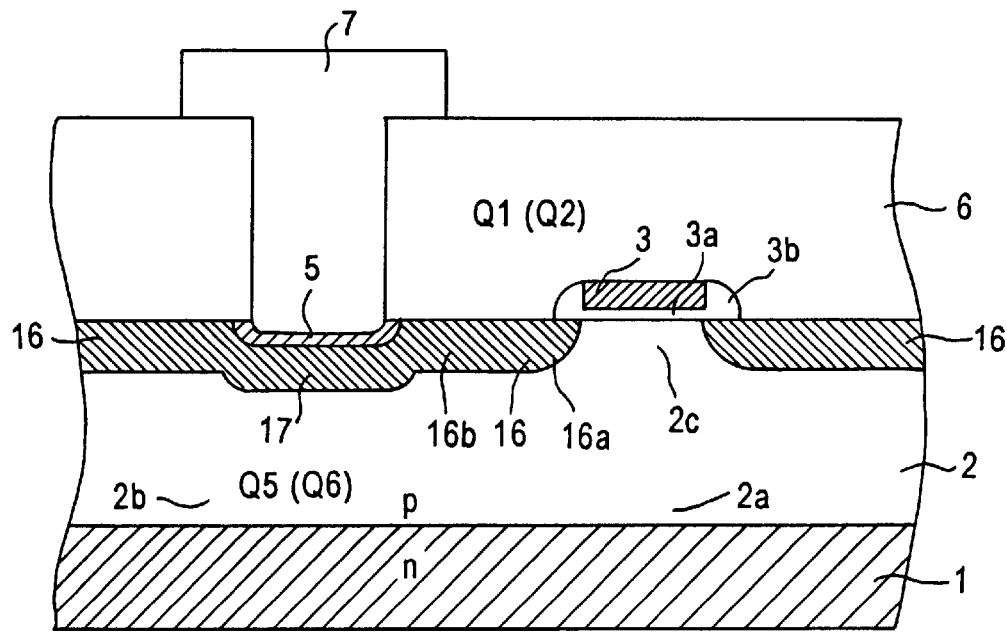
FIG. 3 shows a cross sectional view of a structure of a SRAM cell as an example of a semiconductor memory device constructed in accordance with a third embodiment of the present invention.

Referring to FIG. 3, there is shown a structure of a semiconductor memory device constructed in accordance with the third embodiment of the present invention. The third embodiment differs from the first embodiment of FIG. 1 in that the aforementioned n+ source region (or the drain region) 11 is not formed. The remaining parts are the same as FIG. 1. Since the same reference numerals denote the same parts as FIG. 1 or corresponding parts, a detailed description is omitted for avoiding duplication.

If the device is constructed in the aforementioned way, the source region and drain region of the NMOS transistor Q1 (or Q2) which works as an access transistor will both become n– types, and consequently the current value of the access transistor will be reduced. For this reason, the cell ratio (current ratio) which is defined as the current value of the driver transistor divided by the current value of the access transistor will become larger. Accordingly, there is the advantage that the operation of the memory cell becomes more stable.

Embodiment 4

Figure 4:
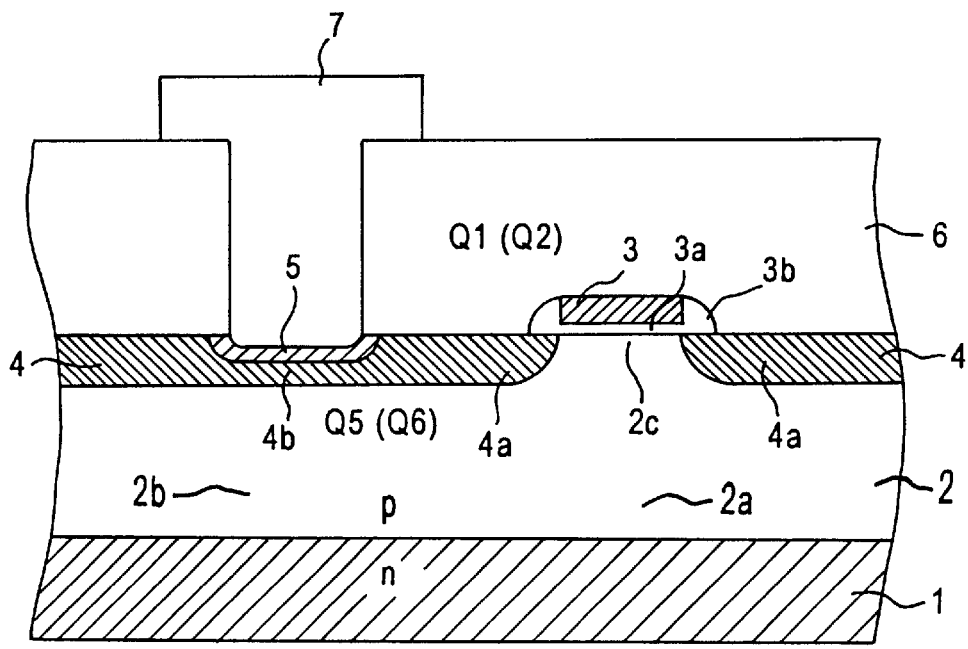
FIG. 4 shows a cross sectional view of a structure of a SRAM cell as an example of a semiconductor memory device constructed in accordance with a fourth embodiment of the present invention.

Referring to FIG. 4, there is shown a structure of a semiconductor memory device constructed in accordance with a fourth embodiment of the present invention. The fourth embodiment differs from the second embodiment of FIG. 2 in that the aforementioned n+ source region (or the drain region) 11 is not formed. The remaining parts are the same as FIG. 2. Since the same reference numerals denote the same parts as FIG. 2 or corresponding parts, a detailed description is omitted for avoiding duplication.

If the device is constructed in the aforementioned way, the source region and drain region of the NMOS transistor Q1 (or Q2) which works as an access transistor will both become n– types, and consequently the current value of the access transistor will be reduced. For this reason, the cell ratio (current ratio) which is defined as the current value of the driver transistor divided by the current value of the access transistor will become larger. Accordingly, there is the advantage that the operation of the memory cell will be more stable.

Embodiment 5

A method of fabricating a semiconductor memory device of the present invention will next be described as a fifth embodiment of the present invention. Referring to FIGS. 5 through 11, there is shown a method of fabricating the semiconductor memory device which has the structure shown in FIG. 1.

Figure 5:
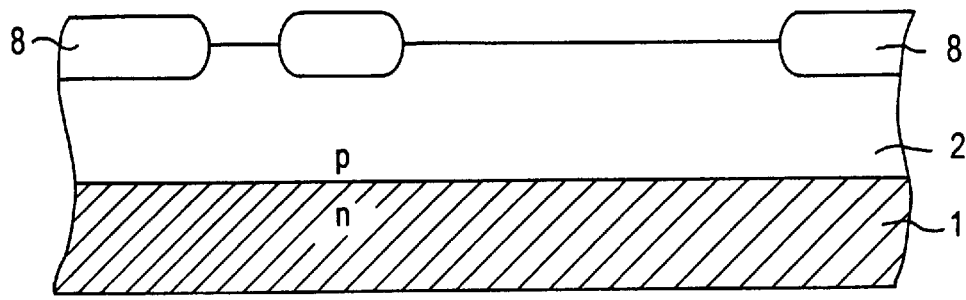

Initially, as shown in FIG. 5, a p well region 2 of a NMOS transistor and isolating oxide films 8 are formed on a n type semiconductor substrate 1 (or the n type well region 1) in the conventional way.

Figure 6:
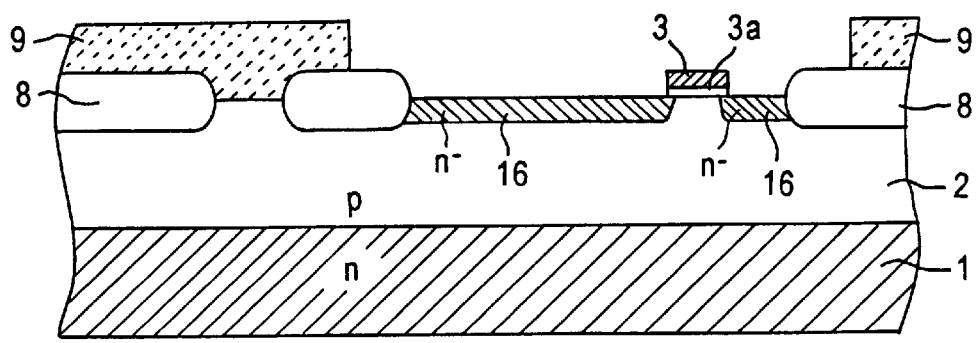

Thereafter, as shown in FIG. 6, a gate oxide film 3a and a gate electrode 3 of the NMOS transistor are formed in the conventional way. Next, n– regions 16, which become source/drain region (S/D region) of the NMOS transistor and a link base region of a bipolar transistor, are formed by employing a resist pattern 9 as a mask. The n– regions 16 are shallowed at a requisite concentration in order to raise the integration degree of the memory cell.

Figure 7:
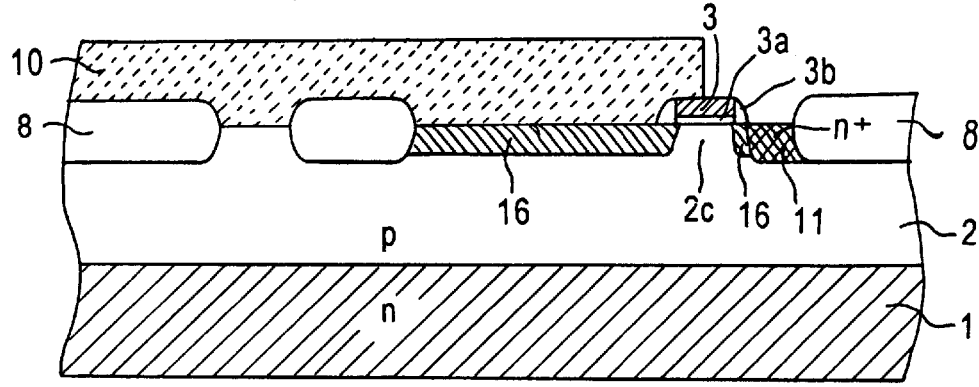

Thereafter, side walls 3b of the gate 3 are formed, as shown in FIG. 7. Next, the n+ source region (or the drain region) 11 with a high impurity concentration is formed by employing a resist pattern 10 as a mask.

Figure 8:
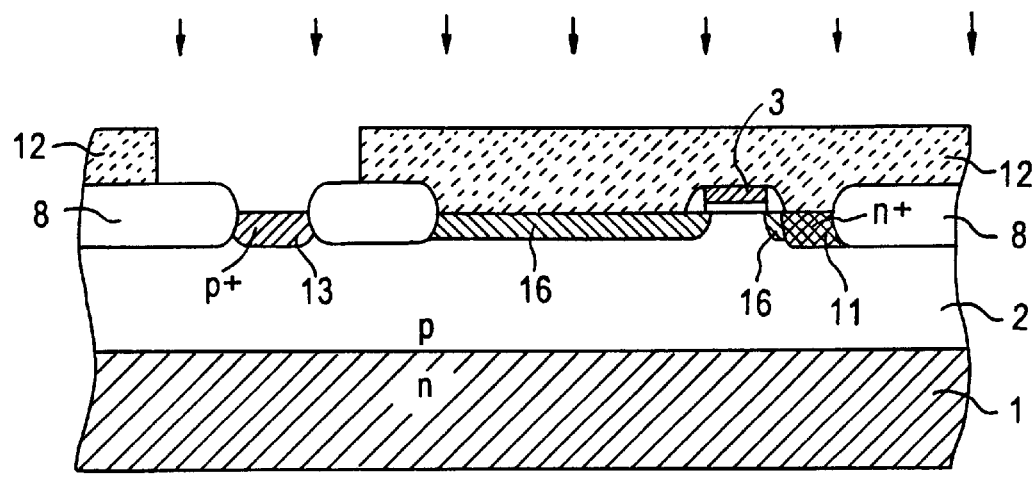

Thereafter, a shown in FIG. 8, a p+ collector contact region 13 (well contact) is formed at the collector pulling-out portion by employing a resist pattern 12 as a mask.

Figure 9:
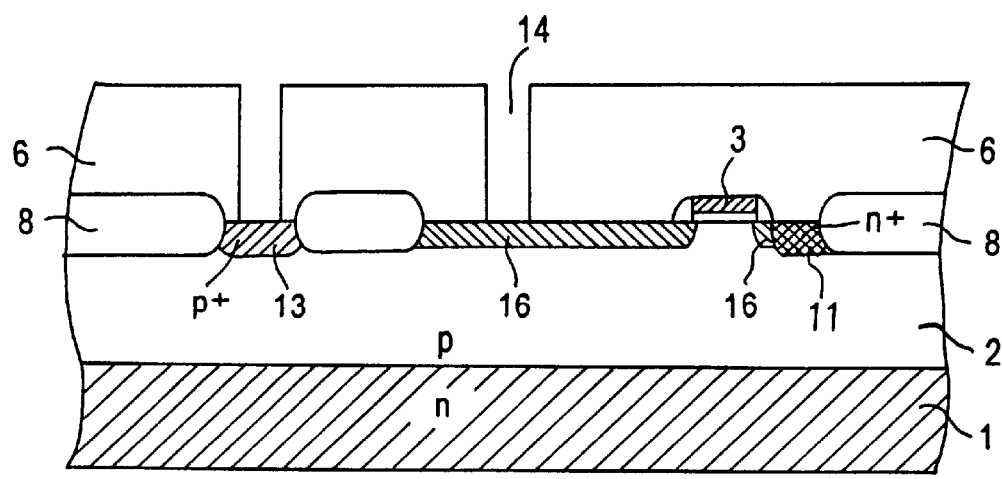

Then, as shown in FIG. 9, an interlayer insulation film 6 is formed, and then bit line contact holes 14 are formed.

Figure 10:
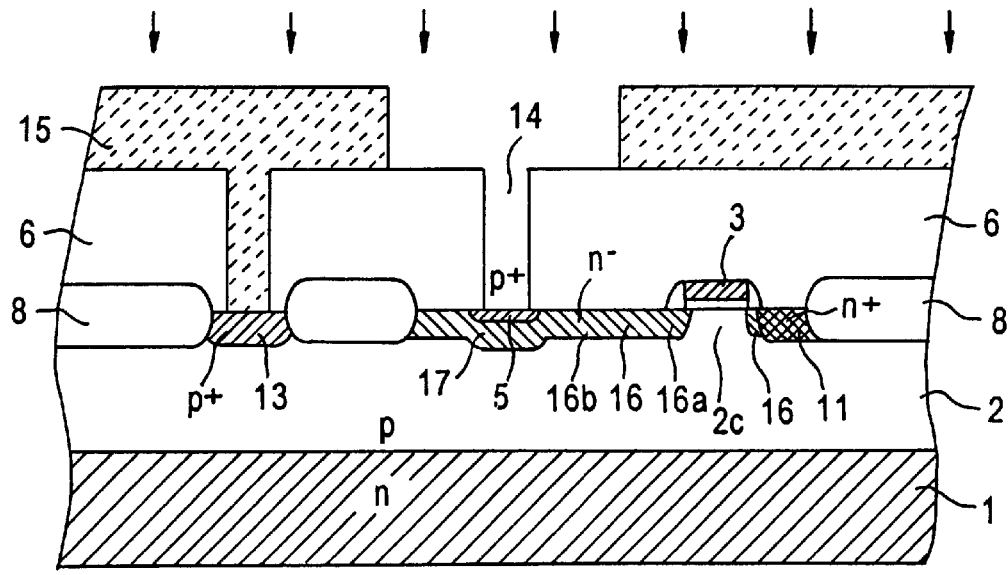

Next, as shown in FIG. 10, there is formed a resist pattern 15, in which a bit line contact hole 14 is opened for forming an emitter of the bipolar transistor. Thereafter, an intrinsic base region 17 with a sufficient thickness is first formed by ion implantation. Then, there is formed an emitter 5 which is shallower than the intrinsic base region 17.

Figure 11:
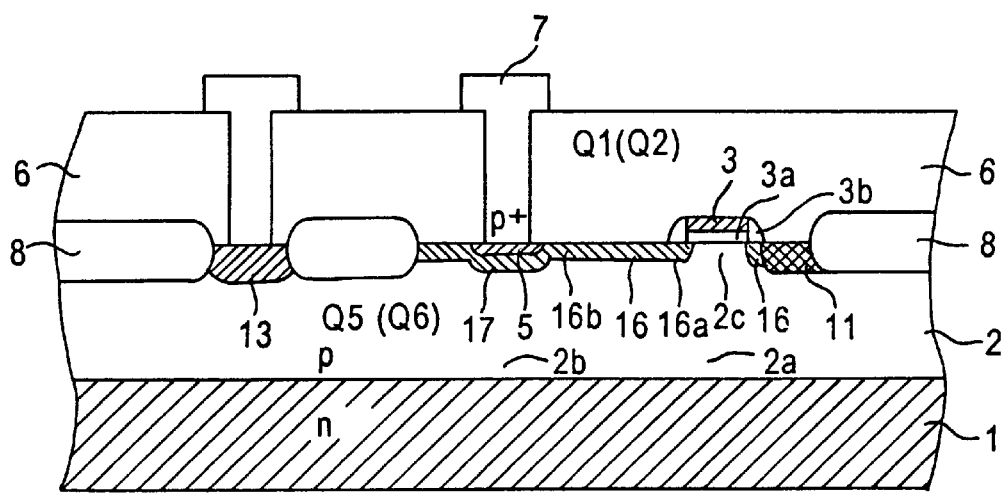

Thereafter, emitter pulling-out electrodes 7 are formed as shown in FIG. 11.

With the aforementioned processes, the NMOS transistor Q1 is formed by the source (or drain) region 11, the drain (or source) region 16a, the channel region 2c, and the gate 3. At the same time, the bipolar transistor Q5 is formed by the emitter 5, the intrinsic base region 17, the link base region 16b, and the collector 2b.

In the aforementioned fabrication method, the drain (or source) region 16a of the access transistor Q1 and the link base region 16b of the bipolar transistor Q5 are formed at the same time, sharing the n type semiconductor layer 16. Therefore, the access transistor Q1 and the bipolar transistor Q5 are connected within the same semiconductor substrate. In addition, since the emitter 5 is formed at the bit line contact portion to form the bipolar transistor Q5, the bipolar transistor Q5 can be fabricated on the silicon substrate 1 without increasing the memory cell area in comparison with the conventional memory cell.

In the aforementioned fabrication method, the base region 16b is formed so as to have a link base structure, and the intrinsic base region 17 is formed in the process of FIG. 10 so as to have a sufficient thickness before the formation of the emitter 5. As a consequence, there is the advantage that the fluctuation of the characteristics of the bipolar transistor Q5 is minimized. In FIG. 10, when the bit line contact hole is opened for forming the emitter of the bipolar transistor, amount of over-etching is varied, and etching of the silicon substrate may fluctuate. Nonetheless, the fluctuation of the characteristics of the bipolar transistor Q5 is small due to the formation of the intrinsic base layer 17.

In the aforementioned fabrication method, in order to prevent a reduction in the punch-through margin or separation voltage characteristic of the access transistor Q1, it is desirable that arsenic (As) with a small diffusion coefficient be implanted as the main impurity of the n type semiconductor layer 16 which includes the drain region (or the source region) 16a. It is also desirable that phosphorus (P) with a large diffusion coefficient is implanted as the main impurity of the intrinsic base region 17, which can firmly secure the base region and make the bipolar transistor Q5 stable.

In addition, the requirement for the fine-structure of the MOS transistor by reduction in the size of the memory cell can be met by implanting arsenic (As) with a small diffusion coefficient as the main impurity of the n type semiconductor layer 16 which includes the drain (or source) region 16a.

In the memory cell of the semiconductor memory device, the minimum transistor gate length and isolation width are used for high integration. For this reason, it is beneficial that the n– region 16, which works as the drain region (or the source region) 16a of the MOS transistor, is shallower, and for example, the depth is formed so as to be less than about 0.1 μm. Therefore, the link base 16b of the bipolar transistor likewise becomes shallow. However, in order to minimize the fluctuation of the characteristics of the bipolar transistor, it is desirable that the base layer have a requisite thickness. For this reason, an intrinsic base layer 17 is formed. Therefore, the intrinsic base layer 17 needs to be deeper than the emitter 5 of the bipolar transistor. For example, in the case where the emitter 5 of the bipolar transistor is formed by implantation, the emitter depth becomes about 0.1 to 0.2 μm, so the intrinsic base layer 17 is made deeper than that. Thus, in order to meet both the high-integration requirement of the memory cell and the requirement for stability of bipolar transistor characteristics, a bipolar transistor with a link base structure is formed within the memory cell.

The emitter pulling-out electrode 7 may be formed either of metal such as an aluminum compound, polysilicon, or a silicide. In the case where polysilicon and a silicide are employed for forming the emitter pulling-out electrode, the emitter 5 of the bipolar transistor may be formed by diffusion from polysilicon.

While this embodiment has been described with reference to the case where the bipolar PNP type transistor and the memory cell employing the NMOS transistor are formed, the same may be said of the case where a bipolar NPN type transistor and the memory cell employing a PMOS transistor are formed.

As a modification of the aforementioned fabrication method, there is a fabrication method where the formation of the n+ source region (or the drain region) 11 having a high concentration of impurity in the process of FIG. 7 is not performed. By this fabrication method, a semiconductor memory device with the structure shown in FIG. 3 can be fabricated. Since the processes other than this process are identical, a detailed description thereof is omitted.

Embodiment 6

Referring to FIGS. 12 through 18, there is shown a method of fabricating a semiconductor memory device which has the structure shown in FIG. 2.

Figure 12:
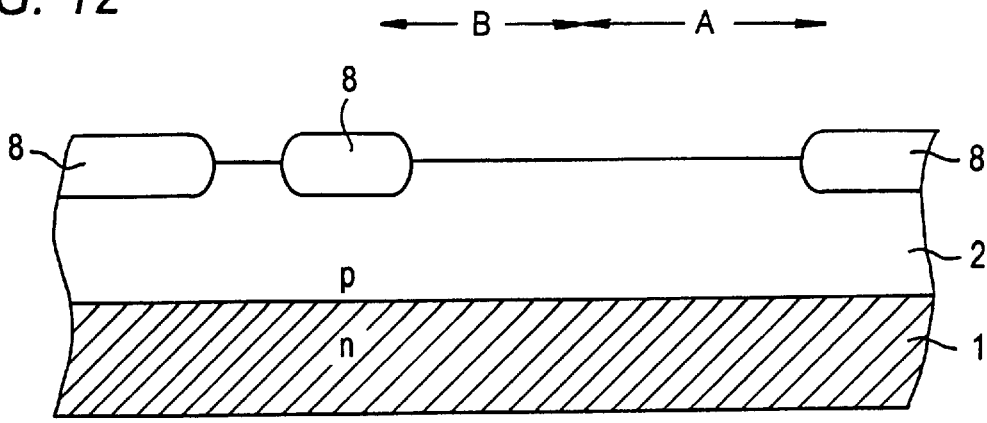

Initially as shown in FIG. 12, a p well region 2 for an NMOS transistor and isolating oxide films 8 are formed on the n type semiconductor substrate 1 (or the n type well region 1) in the conventional way.

Figure 13:
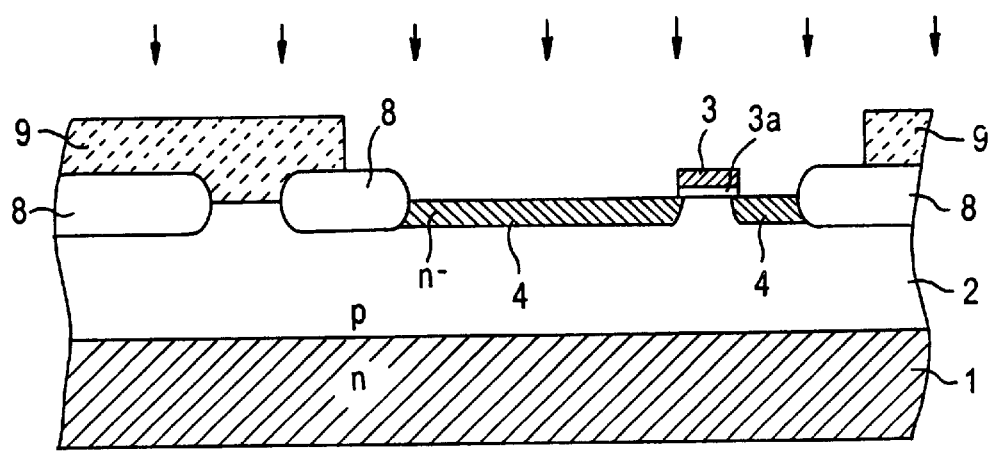

Thereafter, as shown in FIG. 13, a gate oxide film 3a and a gate electrode 3 of a MOS transistor are formed in the conventional way. Next, n– regions 4, which work as source/drain region (S/D region) of the NMOS transistor and a base region of a bipolar transistor, are formed by employing a resist pattern 9 as a mask. In this embodiment, the n– region 4 is formed so as to have a sufficient thickness so that it can function as a base region of the bipolar transistor.

Figure 14:
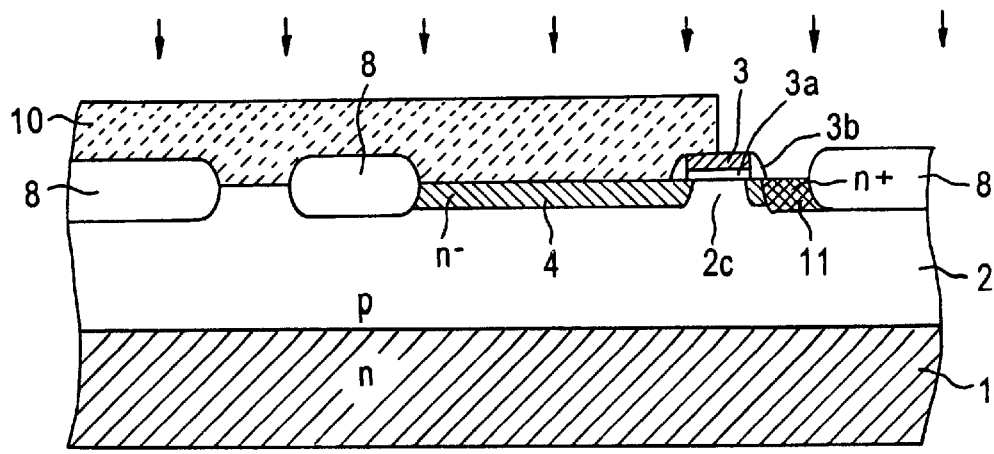

Thereafter, side walls 3b of the gate 3 are formed, as shown in FIG. 14. Next, the n+ drain (or source) region 11 with a high impurity concentration is formed by employing a resist pattern 10 as a mask.

Figure 15:
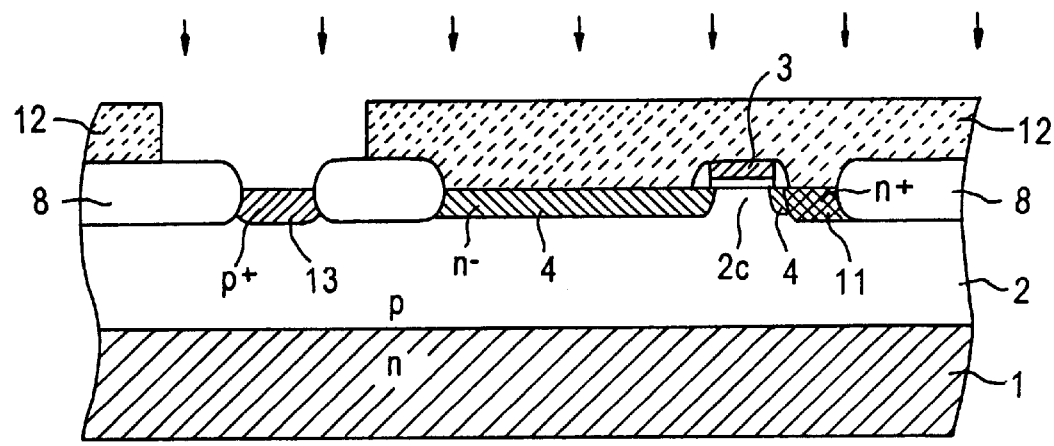

Thereafter, as shown in FIG. 15, a p+ collector contact region 13 (well contact) is formed at a collector pulling-out portion by employing a resist pattern 12 as a mask.

Figure 16:
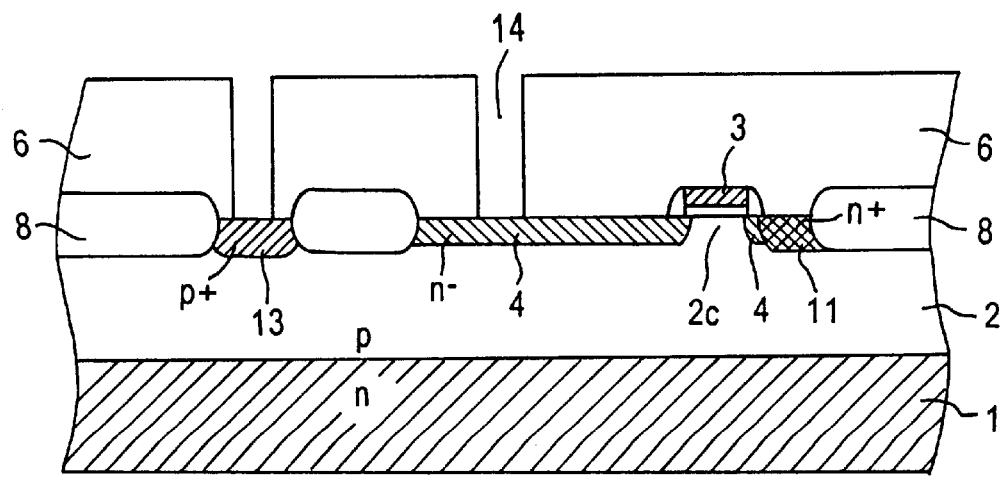

Then, as shown in FIG. 16, an interlayer insulation film 6 is formed, and bit line contact holes 14 are formed.

Figure 17:
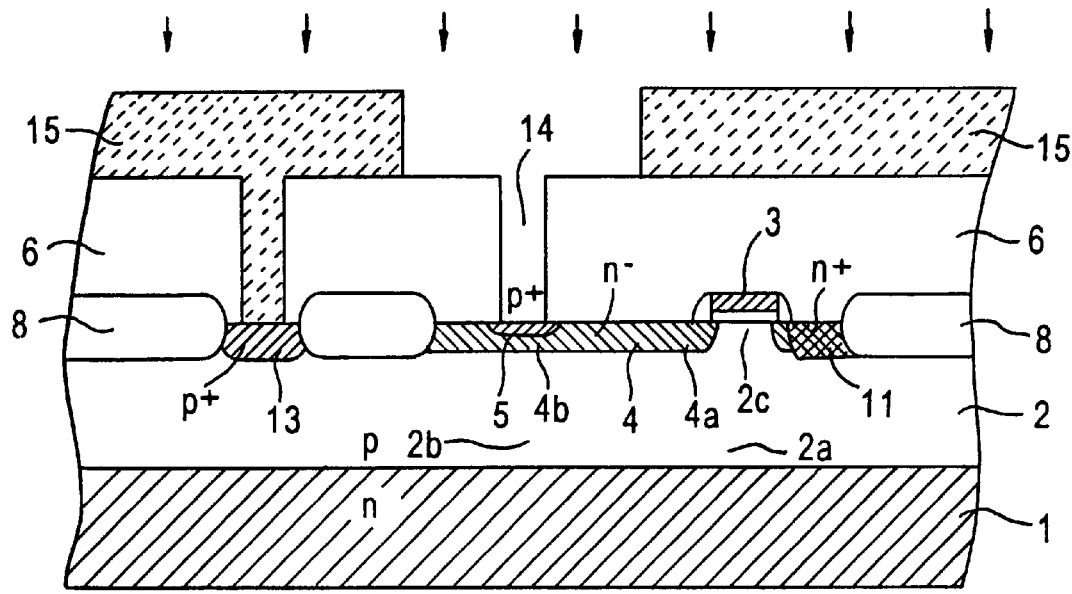

Next, as shown in FIG. 17, there is formed a resist pattern 15, to which a bit line contact hole 14 is opened for forming an emitter of the bipolar transistor. Thereafter, an emitter 5 of the bipolar transistor is formed by ion implantation. The emitter 5 is made shallower than the n– region 4 so that the remaining n– region 4b can function as a base region of the bipolar transistor.

Figure 18:
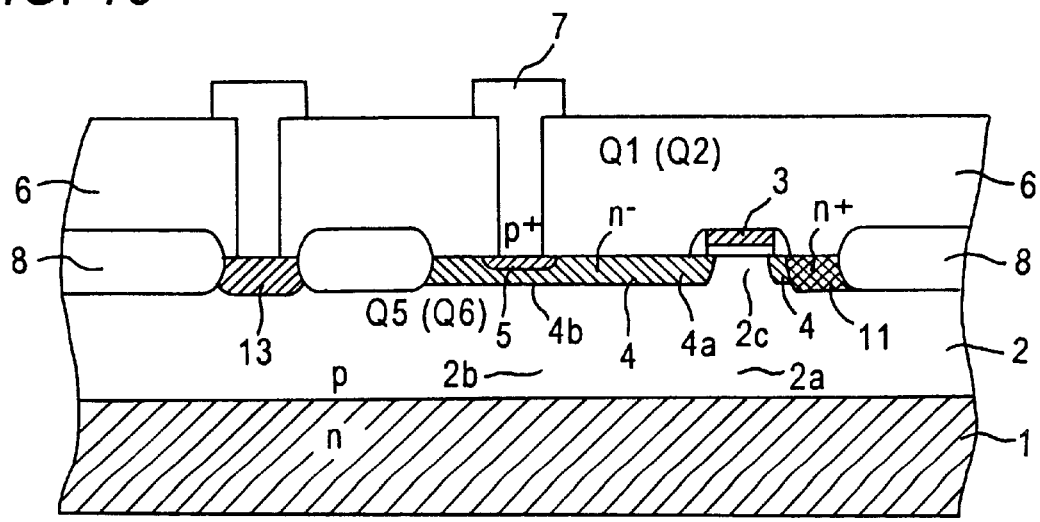

Thereafter, the emitter pulling-out electrodes 7 are formed as shown in FIG. 18.

With the aforementioned processes, the NMOS transistor Q1 is formed by the source (or drain) region 11, the drain (or source) region 4a, the channel region 2c, and the gate 3. At the same time, the bipolar transistor Q5 is formed by the emitter 5, the base 4b, and the collector 2b.

In the aforementioned fabrication method, the drain (or source) region 4a of the access transistor Q1 and the base region 4b of the bipolar transistor Q5 are formed at the same time sharing the n type semiconductor layer 4. Therefore, the access transistor Q1 and the bipolar transistor Q5 are connected within the same semiconductor substrate. In addition, since the emitter 5 is formed at the bit line contact portion to form the bipolar transistor Q5, the bipolar transistor Q5 can be fabricated on the silicon substrate 1 without increasing the memory cell area in comparison with the conventional memory cell.

In addition, in the aforementioned fabrication method, since the drain (or source) region 4a of the NMOS transistor Q1 and the base region 4b of the bipolar transistor Q5 share the n type semiconductor layer 4, this method results in a reduction in the fabrication cost without increasing the number of fabrication processes.

In the aforementioned fabrication method, the n type semiconductor region 4 is also used as the base 4b of the bipolar transistor. Therefore, in the case where phosphorus (P) with a large diffusion coefficient is employed, the base region 4b of the bipolar transistor Q5 can be firmly secured, and the process margin becomes larger, as compared with the case where arsenic (As) with a small diffusion coefficient is employed.

Also, the emitter pulling-out electrode 7 may be formed either of metal such as an aluminum compound, polysilicon, or a silicide. In the case where polysilicon and a silicide are employed for forming the emitter pulling-out electrode, the emitter 5 of the bipolar transistor may be formed by diffusion from the polysilicon or silicide.

While this embodiment has been described with reference to the case where the bipolar PNP type transistor and the memory cell employing the NMOS transistor are formed, the same may be said of the case where a bipolar NPN type transistor and the memory cell employing a PMOS transistor are formed.

As a modification of the aforementioned fabrication method, there is a fabrication method where the formation of the n+ source (or drain) region 11 having a high concentration of impurity in the process of FIG. 14 is not performed. By this fabrication method, a semiconductor memory device with the structure shown in FIG. 4 can be fabricated. Since the processes other than this process are identical, a detailed description thereof is omitted.

Embodiment 7

A description will next be made of a method of fabricating a semiconductor memory device according to a seventh embodiment of the present invention. FIGS. 19 through 24 illustrate the fabrication method of the seventh embodiment in the case where a semiconductor memory device is fabricated by applying a CMOS process. This embodiment relates to a fabrication method in the case where a PMOS transistor is fabricated in a peripheral circuit simultaneously with the fabrication of the NMOS transistor in the memory section shown in FIGS. 5 through 11 or FIGS. 12 through 18.

Figure 19:
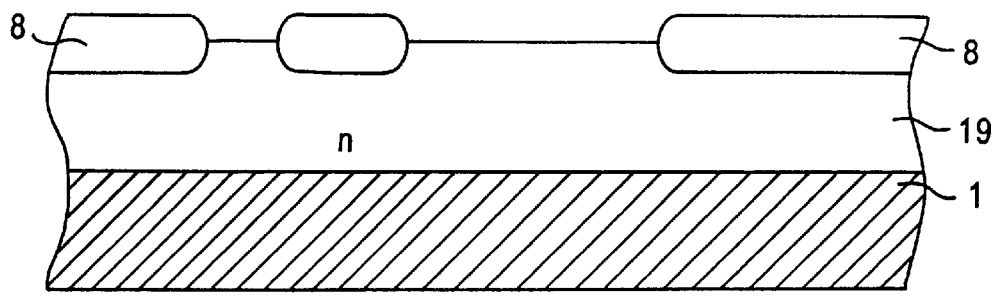

First, as shown in FIG. 19, in parallel with the fabrication process of the NMOS transistor of FIG. 5, an n well region 19 for a PMOS transistor and isolating oxide films 8 are formed on an n type semiconductor substrate 1 in the conventional way.

Then, in parallel with the fabrication process of the NMOS transistor of FIG. 6, a gate oxide film 3a, a gate electrode 3, and sidewalls 3b are formed.

Figure 20:
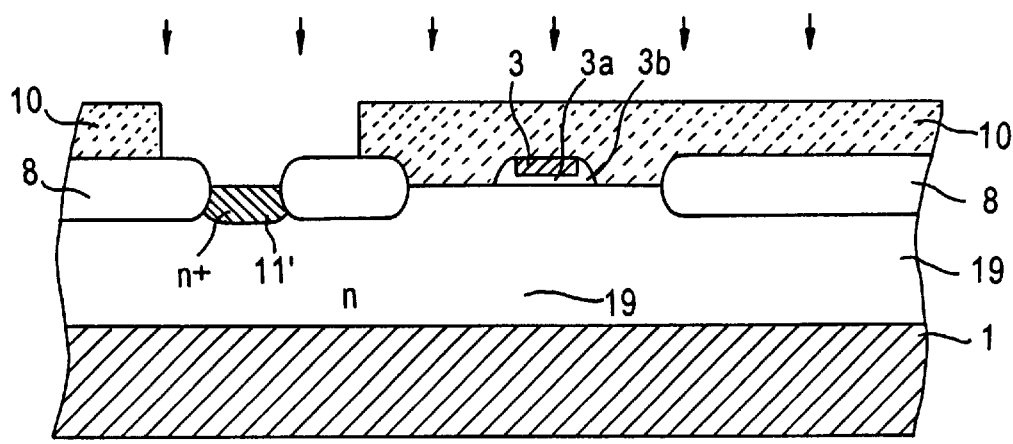

Next, as shown in FIG. 20, in parallel with the fabrication process of the NMOS transistor of FIG. 7, a well contact region 11 is formed simultaneously with the formation of the n+ source (or drain) region 11 of FIG. 7 by employing a common resist pattern 10 as a mask.

Figure 21:
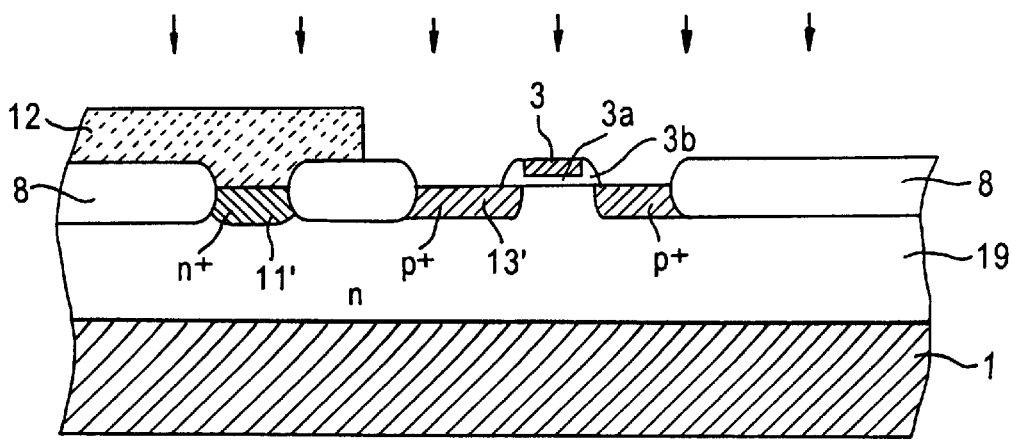

Thereafter, as shown in FIG. 21, in parallel with the fabrication process of the NMOS transistor of FIG. 8, p+ source region/drain regions 13' are formed simultaneously with the formation of the collector contact region 13 of FIG. 8 by employing a common resist pattern 12 as a mask.

Figure 22:
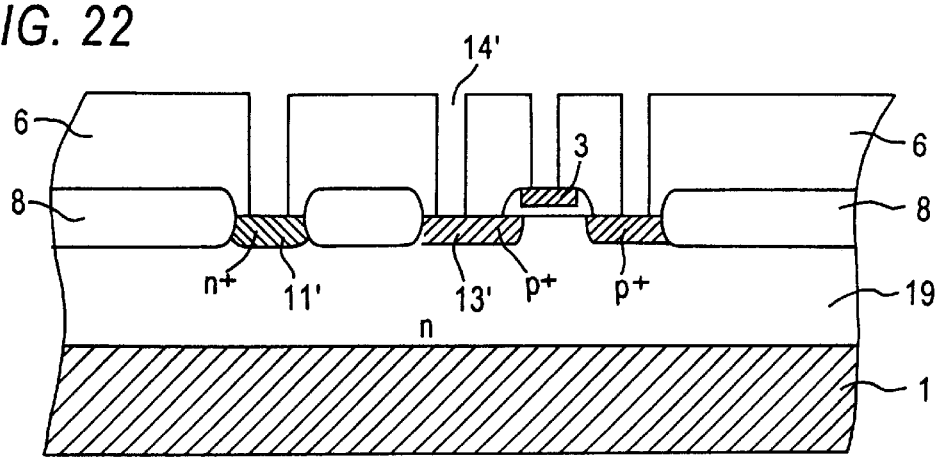

Thereafter, as shown in FIG. 22, in parallel with the fabrication process of the NMOS transistor of FIG. 9, a common interlayer isolation film 6 is formed, and then source/drain contact holes 14' are formed simultaneously with the formation of the bit line contact holes 14 of FIG. 9.

Figure 23:
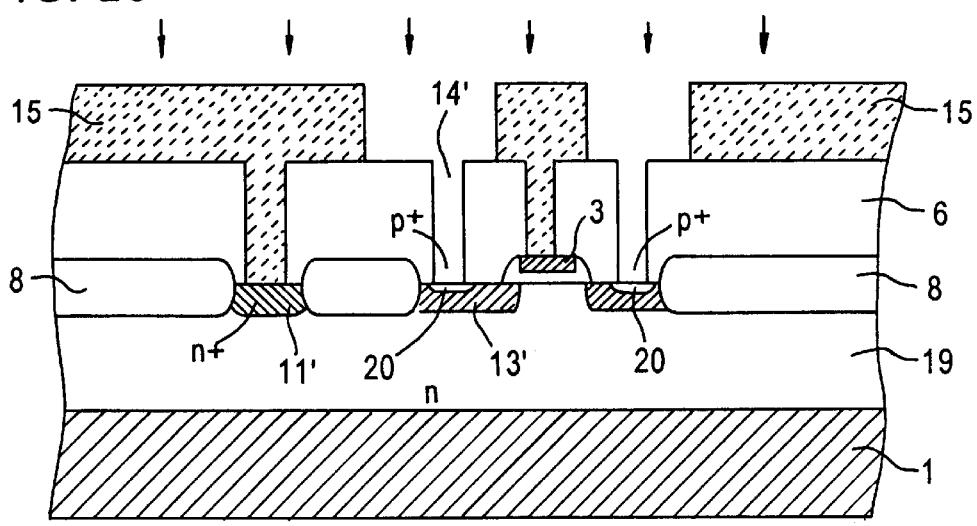

Thereafter, as shown in FIG. 23, in parallel with the fabrication process of the NMOS transistor of FIG. 10, a common resist pattern 15 is formed, in which the source/drain contact holes 14' are opened. Then, p+ contact regions 20 are formed simultaneously with the formation of the emitter 5 of FIG. 10 by ion implantation. In the memory cell section, the resist pattern 15 is a resist pattern for performing the implantation of the emitter of the bipolar transistor, and in the peripheral portion, the resist pattern 15 is a resist pattern for performing the p+ SAC implantation of the PMOS transistor (implantation for making an ohmic contact). Thus, the resist pattern 15 is used for forming both the bipolar transistor and the PMOS transistor.

At this time, in the contact region 20 of the PMOS transistor of the peripheral circuit shown in FIG. 23, impurity implantation of the same quantity as the impurity implanted into the emitter 5 of the bipolar transistor of the memory section shown in FIG. 10 or 17 is performed for the p+ source region and the drain region 13'. As a result, the impurity concentration of the contact region 20 of the PMOS transistor is the sum of the impurity concentration of the emitter 5 of the bipolar transistor in the memory section and the impurity concentration of the p+ source/drain region 13' of the PMOS transistor.

Figure 24:
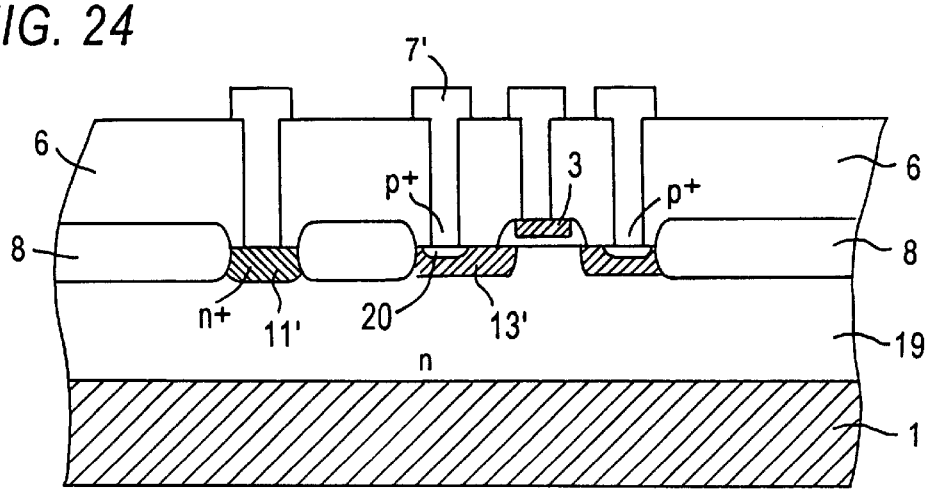

Thereafter, as shown in FIG. 24, in parallel with the fabrication process of the NMOS transistor of FIG. 11, source/drain electrodes 7' are formed simultaneously with the formation of the emitter pulling-out electrode 7 of FIG. 11.

By the aforementioned fabrication method, the PMOS transistor is formed in the peripheral circuit portion in parallel with the formation of the NMOS transistor Q1 and the bipolar transistor Q5 in the memory cell section.

As has been described above, the implantation of the emitter 5 for bipolar transistor formation in the memory cell section can also be used for the implantation of the self aligned contact (SAC) of the PMOS transistor in the peripheral circuit portion. Therefore, this embodiment results in a reduction in the fabrication cost without increasing the number of processes.

As in the case of the emitter pulling-out electrode 7 of FIG. 11 (or FIG. 18), the source/drain electrodes 7' of FIG. 24 may be formed either of metal such as an aluminum compound, polysilicon, or silicide. In the case where polysilicon or silicide is employed for forming the source/drain electrodes 7', the contact region 20 may be formed by diffusion from the polysilicon or silicide.

While the seventh embodiment has been described with reference to the case where the PMOS transistor is formed in the peripheral circuit portion simultaneously with the formation of the bipolar PNP type transistor and the NMOS transistor in the memory cell section, the same may be said of the case where an NMOS transistor is formed in the peripheral circuit portion simultaneously with the formation of a bipolar NPN type transistor and a PMOS transistor in the memory cell section.

According to the present invention, as has been described above, a semiconductor memory device is obtained, in which a semiconductor impurity layer is shared both by a source/drain region of an MOS transistor and a base region of a bipolar transistor in the semiconductor memory section, and in which a bipolar transistor is formed with an emitter at a contact hole for a source/drain region. In addition, this arrangement results in a reduction in fabrication cost without increasing the number of process steps.

According to the present invention, a semiconductor memory device is obtained, in which the source/drain region of an MOS transistor and a link base region of a bipolar transistor are formed in a same semiconductor impurity layer, and in which the bipolar transistor has an intrinsic base region. With this arrangement, the characteristics of the bipolar transistor can be stabilized.

According to the present invention, a semiconductor memory device is obtained, in which a source/drain region of an MOS transistor is made shallow, and the intrinsic base region of a bipolar transistor is made deeper than the source/drain region of the MOS transistor. With this arrangement, the characteristics of the bipolar transistor become stable.

According to the present invention, a semiconductor memory device is obtained, in which an MOS transistor is formed as an access transistor of a SRAM cell and a bipolar transistor is formed at a bit line contact hole of the MOS transistor. This arrangement can provide a semiconductor memory device where a bipolar transistor is formed within the memory cell of a semiconductor memory without increasing the area.

According to the present invention, a semiconductor memory device is obtained, in which one of the source/drain regions of an MOS transistor is of n– type material and the other is of n+ type material. With this, the fine-structure requirement of the MOS transistor can be met.

According to the present invention, a semiconductor memory device is obtained, in which both of the source/drain regions of the MOS transistor are of n– type material. With this, the fine-structure requirement of the MOS transistor can be met.

According to the present invention, a semiconductor memory device is obtained, in which the source/drain regions of an MOS transistor and a base region of a bipolar transistor are both of n– type material having phosphorus as a main impurity. With this arrangement, fabrication cost can be reduced without increasing the number of processes.

According to the present invention, a semiconductor memory device is obtained, in which a main impurity common to the source/drain regions of an MOS transistor and a link base region of a bipolar transistor are made different from that of an intrinsic base region of the bipolar transistor, so that the characteristics of the semiconductor memory device become stable. With this arrangement, the fine-structure requirement of the MOS transistor can be met.

According to the present invention, a semiconductor memory device is obtained, in which a main impurity common to the source/drain regions of an MOS transistor and a link base region of a bipolar transistor is arsenic, and a main impurity of an intrinsic base region of the bipolar transistor is phosphorus. With this arrangement, the fine-structure requirement of the MOS transistor can be met.

According to the present invention, in the case where a CMOS process is applied, and when emitter implantation is performed for forming a bipolar transistor at a memory section which includes a MOS transistor of one conductivity type, an impurity implantation is simultaneously performed for forming a MOS transistor of the other conductivity type at a peripheral portion. Both implantations can be performed by employing a common resist film. As a consequence, fabrication cost can be reduced without increasing the number of process steps.

Numerous additional modifications and variations of the present invention are possible in light of the above teachings. It is therefore to be understood that within the scope of the appended claims, the present invention may be practiced otherwise than as specifically described herein.

We claim:

1. A semiconductor memory device comprising:
    a memory cell including
        a metal-oxide-semiconductor (MOS) transistor having source/drain regions located across a channel region formed on a principal plane of a semiconductor region in a semiconductor memory section; and
        a bipolar transistor having an emitter region, a base region and a collector region; said emitter region being formed at a contract hole for said source/drain region; said base region being constituted by a region common to said source/drain region; and said collector region being constituted by said semiconductor region;
    said bipolar transistor being arranged between said MOS transistor and an isolation region to provide electrical isolation of said bipolar transistor from circuitry external with respect to said memory cell.

2. A semiconductor memory device comprising:
    a metal-oxide-semiconductor (MOS) transistor having source/drain regions located across a channel region formed on a principal plane of a semiconductor region in a semiconductor memory section; and
    a bipolar transistor having an emitter region, a base region and a collector region; said emitter region being formed at a contract hole for said source/drain region; said base region being constituted by a region common to said source/drain region; and said collector region being constituted by said semiconductor region;
    wherein an intrinsic base region is disposed between said emitter region and said collector region of said bipolar transistor; and said intrinsic base region being made deeper than said base region.

3. The semiconductor memory device as set forth in claim 2, wherein said source/drain region is made shallow and said intrinsic base region is made deeper than said source/drain region.

4. The semiconductor memory device as set forth in claim 2, wherein a main impurity, common to both said source/drain regions of said MOS transistor and said link base region of said bipolar transistor, is different from that of said intrinsic base region of said bipolar transistor.

5. The semiconductor memory device as set forth in claim 4, wherein a main impurity, common to both said source/drain regions of said MOS transistor and said link base region of said bipolar transistor, is arsenic, and a main impurity of said intrinsic base region of said bipolar transistor is phosphorus.

6. The semiconductor memory device as set forth in claim 1, wherein said MOS transistor is formed as an access transistor of a static random access memory (SRAM) cell and said bipolar transistor is formed at a bit line contact hole of said MOS transistor.

7. The semiconductor memory device as set forth in claim 1, wherein said semiconductor region is of a p type material, one of said source/drain regions is of an n− type material, and the other of said source/drain regions is of an n+ type material.

8. The semiconductor memory device as set forth in claim 1, wherein said semiconductor region is of a p type material, and both of said source/drain regions are of n− type material.

9. The semiconductor memory device as set forth in claim 1, wherein said semiconductor region is of a p type material, and said source/drain region and said base region are of n− type material with phosphorus as a main impurity.

10. The semiconductor memory device as set forth in claim 1, wherein said emitter region of said bipolar transistor is formed simultaneously with the formation of a contact layer for a source/drain region of another MOS transistor of a conductivity type opposite that of said MOS transistor.

11. The semiconductor memory device as set forth in claim 10, wherein the sum of the impurity concentration of said emitter region of said bipolar transistor and the impurity concentration of said source/drain region of said another MOS transistor is substantially equal to the impurity concentration of said source/drain region of said another MOS transistor.

12. The semiconductor memory device as set forth in claim 1, wherein the base region of said bipolar transistor is electrically isolated by said isolation region from the external circuitry.

13. The semiconductor memory device as set forth in claim 1, wherein said isolation region electrically isolates said bipolar transistor from other memory cells of said semiconductor memory device.

* * * * *

UNITED STATES PATENT AND TRADEMARK OFFICE
CERTIFICATE OF CORRECTION

PATENT NO. : 5,959,334
DATED : September 28, 1999
INVENTOR(S) : YUKIO MAKI, et al.

It is certified that error appears in the above-indentified patent and that said Letters Patent is hereby corrected as shown below:

In Claim 1, Column 13, Line 15, change "contract " to --contact--.

In Claim 2, Column 13, Line 32, change "contract" to --contact--.

Signed and Sealed this

Twenty-seventh Day of March, 2001

Attest:

NICHOLAS P. GODICI

Attesting Officer

Acting Director of the United States Patent and Trademark Office